United States Patent
Buendia et al.

[11] Patent Number: 5,993,591
[45] Date of Patent: Nov. 30, 1999

[54] CORING OF LEADFRAMES IN CARRIERS VIA RADIANT HEAT SOURCE

[75] Inventors: Jesus S. Buendia, Richardson; Katherine Gail Heinen, Dallas; Gonzalo Amador, Dallas; Leslie E. Stark, Dallas, all of Tex.

[73] Assignee: Texas Instruments Incorporated, Dallas, Tex.

[21] Appl. No.: 08/991,128

[22] Filed: Dec. 16, 1997

Related U.S. Application Data

[60] Provisional application No. 60/032,495, Dec. 18, 1996.

[51] Int. Cl.$^6$ .................................................... B32B 31/26
[52] U.S. Cl. .................................. 156/275.5; 156/275.7; 156/359; 156/380.9; 156/497; 392/422
[58] Field of Search ............................. 156/275.5, 275.7, 156/285, 359, 380.9, 382, 497; 219/85.12, 400, 85.13; 392/416, 418, 422, 423, 424; 362/345; 264/492, 493

[56] References Cited

U.S. PATENT DOCUMENTS

| | | | |
|---|---|---|---|
| 3,864,547 | 2/1975 | Ray | 392/410 |
| 4,257,172 | 3/1981 | Townsend | 34/68 |
| 5,332,557 | 7/1994 | Sahoda et al. | 392/418 |
| 5,569,402 | 10/1996 | Meisser et al. | 219/400 |
| 5,763,856 | 6/1998 | Ohkase | 392/416 |
| 5,846,476 | 12/1998 | Hwang et al. | 264/493 |

FOREIGN PATENT DOCUMENTS

| | | |
|---|---|---|
| 0 691 679 A2 | 1/1996 | European Pat. Off. . |
| 0 691 679 A3 | 1/1996 | European Pat. Off. . |
| 60-193343 | 10/1985 | Japan . |
| 5-055277 | 3/1993 | Japan . |
| 7-319080 | 12/1995 | Japan . |

*Primary Examiner*—Michael W. Ball
*Assistant Examiner*—Michael A Tolin
*Attorney, Agent, or Firm*—Wade James Brady III; Richard L. Donaldson

[57] ABSTRACT

A method and system for curing a die attach material for attachment of a semiconductor die to a leadframe which includes a carrier receiving location for receiving at least one carrier(1) wherein each carrier contains at least one leadframe strip (3) therein, a die attach material (15) on the leadframe strip and a semiconductor die (13) on the die attach material. A heat source (5) is provided for radiating thermal energy to the carrier receiving location. A reflector (9) is disposed around the heat source and the carrier receiving location for reflecting thermal energy from the heat source to the carrier receiving location. A source of flowing cool gas (11) is provided in heat exchange relationship with the reflector for cooling the reflector while heating the gas. The heated gas is passed through the carrier receiving location to provide a source of heat by convection at the carrier receiving location and purge the carrier receiving location of volatiles. The heat source provides radiations principally in the range of from about $0.5\mu$ to about $2.0\mu$ and is preferably a tungsten halogen lamp. The heat source is controllable responsive to a function of the instantaneous temperature of the die attach material and the leadframe strip to control the intensity and profile of the heat source. Cooling air is optionally injected into the system upon completion of curing.

22 Claims, 1 Drawing Sheet

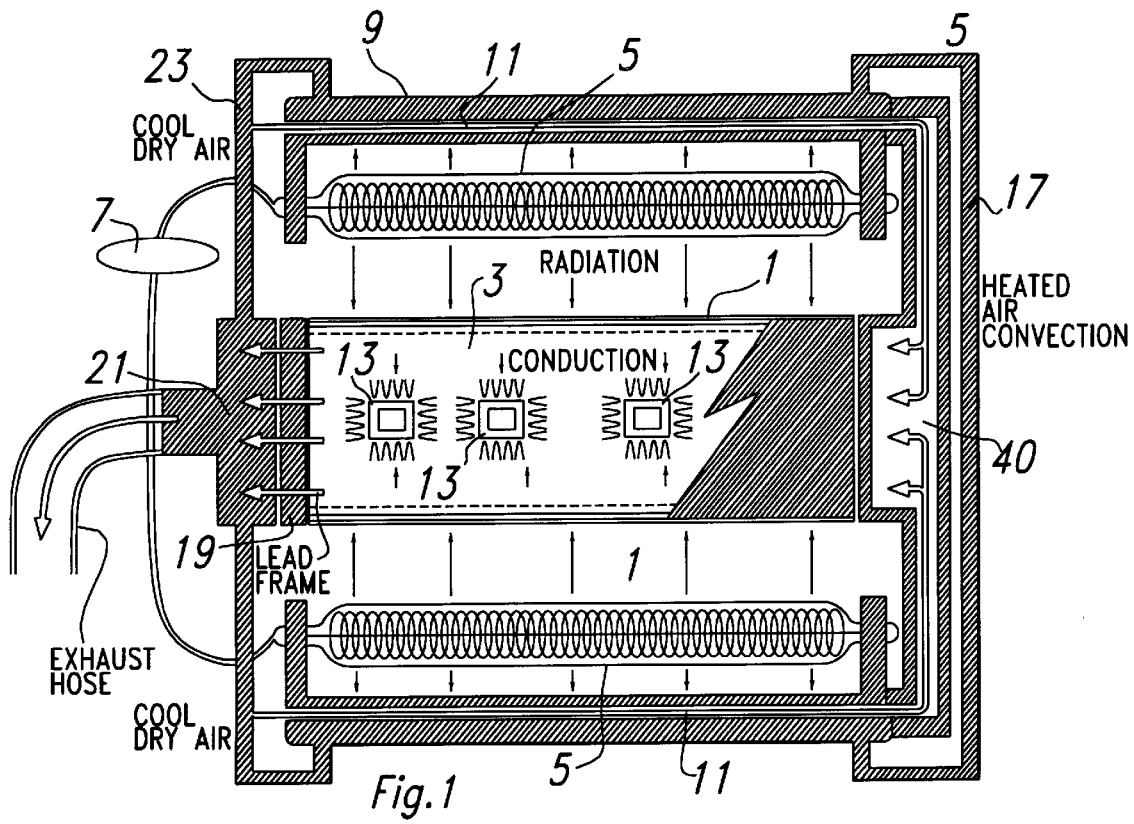
Fig.1
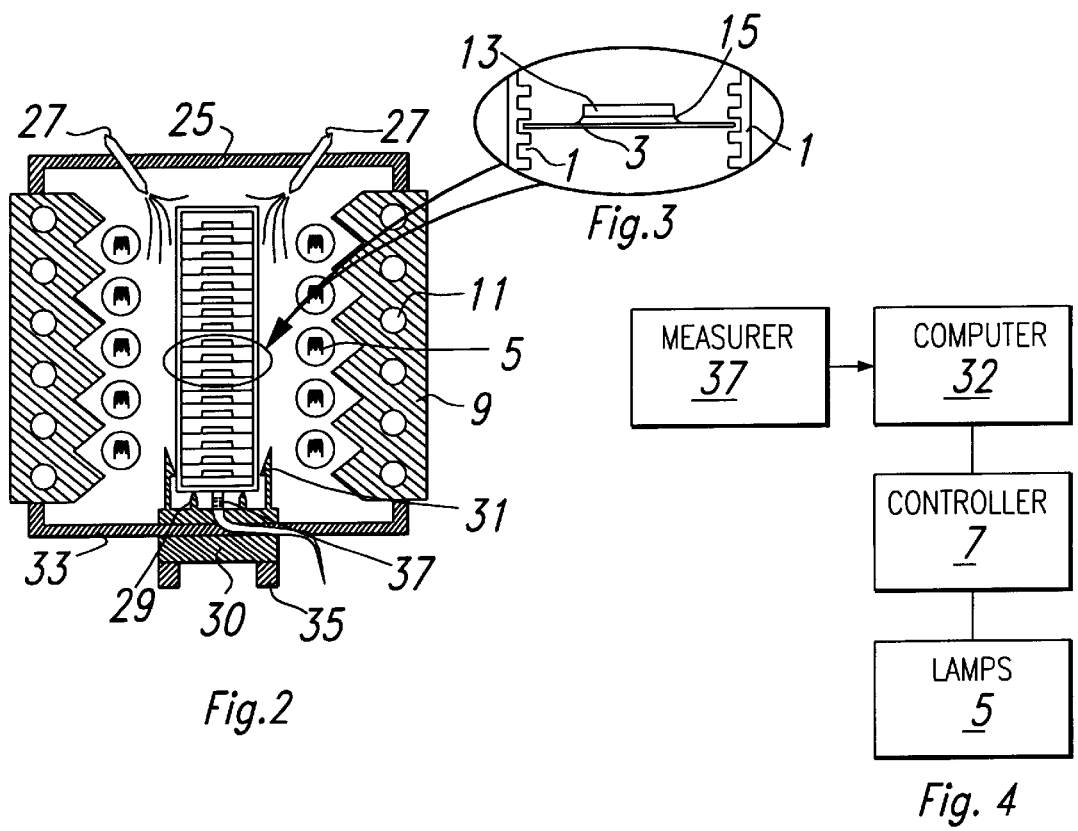
Fig.2
Fig.3
Fig. 4

CORING OF LEADFRAMES IN CARRIERS VIA RADIANT HEAT SOURCE

This application claims priority under 35 USC § 119(e)(1) of provisional application Ser. No. 60/032,495 filed Dec. 18, 1996.

BACKGROUND OF THE INVENTION

1. Field of the Invention

This invention relates to a system and method for curing of thermosettable materials and melting of thermoplastics in general and, more specifically, for curing die attach to leadframes for semiconductor devices.

2. Brief Description of the Prior Art

In the fabrication of semiconductor devices, an important step is that of bonding of the semiconductor die to a lead frame or the like prior to the wire bonding operations. Many processes have been used in the prior art to perform this function as discussed in S. M. Sze, *VLSI Technology*, 2nd Edition, pp 586–589, 1988 as well as processes developed subsequent to that publication. The predominant and most common die attach cure process used in the industry at present is a through batch cure process in a nitrogen purge convection oven. This process involves a long cure cycle time due to the slow response time of the heat source. Volatiles due to outgassing and the like may remain in the oven during processing.

With the advent of the snap cure die attach materials, other solutions that were developed were the use of heater blocks and optical lamps known as rapid cure process (RCP). In the case of both of these solutions, energy is transferred directly to the leadframe and curing of units is accomplished on a per strip basis (one leadframe strip at a time per station). The heater block makes use of conduction for heat transfer while RCP uses radiation as its primary heat transfer mechanism to cure the die attach material.

The conventional RCP cure process utilizes direct transfer of energy from lamp to target so leadframes are individually cured. This limitation hinders this procedure from supporting in-line cure of high productivity manufacturing equipment. While RCP is quite rapid in temperature response of the target, it is slow because it operates on a "line of sight" basis and cures only one leadframe at a time. It is therefore readily apparent that the prior art procedures for die attach have demonstrated a relatively low throughput.

SUMMARY OF THE INVENTION

In accordance with the present invention, the above problems demonstrated by the prior art are minimized and there is provided a procedure and apparatus for curing the die attach of lead frames with larger throughput than is available in the prior art.

Briefly, an optical lamp capable of providing a large portion of its energy output in the range of from about $0.5\mu$ to about $2.0\mu$, preferably a tungsten halogen lamp of the type disclosed in Ser. No. 08/255,197, the contents of which are incorporated herein by reference, is utilized as the heat energy source to take advantage of the quick response time of such energy sources. The energy from the lamp is directed mainly to the carrier(s) which are formed from a highly thermally conductive material, preferably aluminum. The leadframes are also preferably formed of a highly thermally conductive material so that they can attain the desired temperature rapidly and uniformly within the carrier. Accordingly, the system utilizes a combination of (1) conduction of the heat radiated from the heat source to the carrier(s) and then to the lead frame strip disposed within the carrier to the material to be cured and (2) convection by heat transfer via heated gas to simultaneously cure the material to be cured on all of the leadframes on the leadframe strips contained within the carrier(s). While the heated gas as described in greater detail hereinbelow does perform the heating action by convection as described above, the main purpose of the flowing gas is to remove outgassing due to the curing process.

The system includes a carrier receiving location wherein one or more removable carriers are positioned, each carrier containing one or more leadframe strips, each leadframe strip composed of one or a plurality of serially connected leadframes, one or plural such leadframe strips being stacked within each carrier. It should be understood that plural such carriers can be provided in the system concurrently, the carriers being either stacked or in side by side relation. A heat energy source of the type described above, preferably a tungsten halogen lamp, is disposed on one or both sides of the carrier(s). The energy provided by the lamps is controllable by a computer operated controller which is responsive to some predetermined function of the temperature within the system to insure that the proper curing temperature and curing profile for the die attach being cured is maintained.

The carriers and lamps are surrounded, at least in part, by a reflector having open end regions for the passage of gas in an axial path within the reflector and through the carriers. The reflector reflects energy emanating from the lamps back toward the carriers and leadframe strips. The reflector optionally has a gas, preferably air, passage therein through which a relatively cool gas travels to cool the reflector while the gas itself becomes heated due to the heat exchange between the gas and the reflector. When the heated gas emerges from the passage, this heated gas becomes the gas passed through the carriers and over the leadframes strips to provide additional heating as well as to purge any volatiles from the system which may have been created due to the curing of the die attach or for any other reason. The volume of gas per unit of time passing through the carriers is optimized for a clean process while maintaining the temperature within the carriers within a predetermined range to avoid excessive cooling. In other words, the maximum volume of air is passed through the carriers consistent with control against excessive temperature drop within the carriers. The parameters themselves are a function of the particular apparatus and die attach materials being used.

Cool dry air is forced through the cooling channels of the reflectors. At the exit of these channels, an air plenum conducts the air to one end of the carrier containing the lead frames with the die attach being cured. Located at the other end of the carrier is an exhaust manifold. Between the exhaust manifold and the open end of the carrier is a diffuser plate which covers the entire open area of the carrier. The purpose of the diffuser plate is to create uniform air flow along the height of the carrier. The air passes through the carrier, through the diffuser plate, through the exhaust manifold and is conducted out of the system through an exhaust hose with the volatiles picked up due to outgassing. Heating continues in this manner until the curing profile has been completed. A forced air convection cooling period may be necessary to lower the temperature of the carrier in a controlled predetermined profile to enhance the quality of the die attach cure and to enable transport of the carrier. Then the carrier with leadframe strips therein is removed from the system for further processing and the procedure is repeated with a new set of carriers and leadframe strips.

The above described process is more flexible than the prior art in terms of accommodating in-line processes due to the increased throughput and for stand alone set-up options. This process allows modular assembly with minimum footprint. The system is a closed loop system, thereby providing temperature control. The continuous flow of air through the carriers provides a comparable if not cleaner cure than the sealed type batch cure process in nitrogen purge convection ovens. Handling is also reduced because the leadframe strips are retained within the carriers and not handled individually.

BRIEF DESCRIPTION OF THE DRAWINGS

FIG. 1 is a top, cut away view of the curing system in accordance with the present invention;

FIG. 2 is a cross sectional view taken along the line 2—2 of FIG. 1; and

FIG. 3 is an enlarged view of the carrier with leadframe and die attach beneath a die.

FIG. 4 is a diagram showing the interaction of a computer with other components of the system.

DESCRIPTION OF THE PREFERRED EMBODIMENT

Referring to the figures, there is shown a heat transfer or curing system in accordance with the present invention. The system includes a carrier receiving location whereat is disposed a removable carrier 1 (it should be understood that plural such carriers can be stacked on each other an/or plural such carriers can be disposed in side by side relation), which is highly thermally conductive, preferably formed from aluminum and containing one or more leadframe strips 3 stacked therein. The carrier 1 is disposed on a pair of relatively low thermal conductivity carrier base support knife edges 29 and held in place laterally by a pair of relatively low thermal conductivity carrier side locators with knife edge contact 31, both secured to a base 30 in the base cover 33 which is disposed on a stand-off thermal barrier 35 to thermally isolate the carrier. A spring loaded thermocouple or non contact pyrometer 37 is also disposed in the base 30 to provide a measure of the temperature of the carrier external to the system. The top cover 25 hinges open or retracts to allow loading/unloading of a carrier 1, the system being closed during a curing operation.

A semiconductor die 13 is disposed on each lead frame portion of each leadframe strip 3 with a die attach material 15 disposed under the die and on the leadframe portion in standard manner for curing. A heat energy source in the form of a tungsten halogen lamp 5 is disposed on both sides of the carriers 1. The energy provided by the lamps 5 is controllable by a computer 32 operated power controller 7, such as, for example, a rheostat, which is responsive to some predetermined function of the temperature within the system to insure that the proper curing temperature and curing profile for the die attach being cured is maintained as shown in FIG. 4. The carrier 1 and lamps 5 are surrounded by a reflector 9 having open end regions for reflecting energy emanating from the lamps 5 back toward the carrier and leadframe strips 3. The reflector 9 has a passage 11 therein for gas, preferably air, through which a relatively cool gas travels to cool the reflector while the gas itself becomes heated due to the heat exchange between the gas and the reflector.

When the heated gas emerges from the passage 11, this heated gas is deflected by an air plenum 40 and directed through the carrier 1 and over the leadframe strips 3 to provide additional heating to the die attach 15 and leadframe strips 3 as well as to purge any volatiles from the system which may have been created due to the curing of the die attach from outgassing or for any other reason. This gas with volatiles is then exhausted from the system via a diffuser plate 19 and through an exhaust manifold 21 in end cover 23 to maintain the system in a constantly purged condition. Heating continues in this manner until the curing process has been completed, whereupon the carrier 1 with leadframe strips therein is removed from the system for further processing.

An optional forced air convection cooling period is now provided, if necessary, to lower the temperature of the carrier in a controlled predetermined profile to enhance the quality of the die attach cure and to enable transport of the carrier. This is accomplished by forcing cooling air through a jet or jets 27 in the top cover 25 of the system after completion of the curing process. The procedure is then repeated with a new set of carriers and leadframe strips.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A method for curing a thermosettable material or melting a thermoplastic material which comprises the steps of:

(a) providing at least one carrier and a carrier receiving location for receiving each carrier wherein each carrier contains at least one member strip therein having said thermosettable or thermoplastic material thereon;

(b) providing a heat source for radiating thermal energy to said carrier receiving location and for transferring heat to said carrier receiving location by convection by heating a gas source travelling to said carrier receiving location;

(c) providing a reflector disposed around said heat source and said carrier receiving location for reflecting thermal energy from said heat source to said carrier receiving location; and (d) providing an exhaust system to cause the heated gas to pass through said carrier receiving location to provide a source of heat by convection at said carrier receiving location and purge said carrier receiving location of volatiles.

2. A system for curing a die attach material for attachment of a semiconductor die to a leadframe which comprises:

(a) at least one carrier and a carrier receiving location for receiving each carrier wherein each carrier contains at least one leadframe strip therein, a die attach material on said leadframe strip and a semiconductor die on said die attach material;

(b) a heat source for radiating thermal energy to said carrier receiving location and for transferring heat to said carrier receiving location by convection by heating a gas source travelling to said carrier receiving location;

(c) a reflector disposed around said heat source and said carrier receiving location for reflecting thermal energy from said heat source to said carrier receiving location; and (d) an exhaust system to cause the heated gas to pass through said carrier receiving location to provide a source of heat by convection at said carrier receiving location and purge said carrier receiving location of volatiles.

3. The system of claim 2 further including a first source of flowing cool gas in heat exchange relationship with said reflector for cooling said reflector while heating said gas.

4. The system of claim 2 wherein said heat source provides radiations principally in the range of from about $0.5\mu$ to about $2.0\mu$.

5. The system of claim 2 further including means responsive to a function of the instantaneous temperature of said die attach material and said leadframe strip to control the intensity and profile of said heat source.

6. The system of claim 3 further including means responsive to a function of the instantaneous temperature of said die attach material and said leadframe strip to control the intensity and profile of said heat source.

7. The system of claim 4 further including means responsive to a function of the instantaneous temperature of said die attach material and said leadframe strip to control the intensity and profile of said heat source.

8. The system of claim 3 further including said at least one carrier at said carrier receiving location, each said carrier containing at least one leadframe strip therein, a die attach material on said leadframe strip and a semiconductor die on said die attach material.

9. The system of claim 4 further including said at least one carrier at said carrier receiving location, each said carrier containing at least one leadframe strip therein, a die attach material on said leadframe strip and a semiconductor die on said die attach material.

10. The system of claim 5 further including said at least one carrier at said carrier receiving location, each said carrier containing at least one leadframe strip therein, a die attach material on said leadframe strip and a semiconductor die on said die attach material.

11. The system of claim 6 further including said at least one carrier at said carrier receiving location, each said carrier containing at least one leadframe strip therein, a die attach material on said leadframe strip and a semiconductor die on said die attach material.

12. The system of claim 7 further including said at least one carrier at said carrier receiving location, each said carrier containing at least one leadframe strip therein, a die attach material on said leadframe strip and a semiconductor die on said die attach material.

13. The system of claim 2 further including a second cool air inlet for injecting cooling air into said system upon completion of curing.

14. The system of claim 12 further including a second cool air inlet for injecting cooling air into said system upon completion of curing.

15. A method for curing a die attach material for attachment of a semiconductor die to a leadframe which comprises the steps of:

(a) providing at least one carrier and a carrier receiving location for receiving each carrier wherein each carrier contains at least one leadframe strip therein, a die attach material on said leadframe strip and a semiconductor die on said die attach material;

(b) providing a heat source radiating thermal energy to said carrier receiving location and for transferring heat to said carrier receiving location by convection by heating a gas source travelling to said carrier receiving location;

(c) providing a reflector disposed around said heat source and said carrier receiving location for reflecting thermal energy from said heat source to said carrier receiving location with a reflector disposed around said heat source and said carrier receiving location; and (d) passing the heated gas through said carrier receiving location to provide a source of heat by convection at said carrier receiving location and purging said carrier receiving location of volatiles.

16. The method of claim 15 further including the step of flowing cool gas in heat exchange relationship with said reflector for cooling said reflector while heating said gas.

17. The method of claim 15 wherein said heat source provides radiations principally in the range of from about $0.5\mu$ to about $2.0\mu$.

18. The method of claim 15 further including the step of controlling the intensity and profile of said heat source responsive to a function of the instantaneous temperature of said die attach material and said leadframe strip.

19. The method of claim 16 further including the step of controlling the intensity and profile of said heat source responsive to a function of the instantaneous temperature of said die attach material and said leadframe strip.

20. The method of claim 17 further including the step of controlling the intensity and profile of said heat source responsive to a function of the instantaneous temperature of said die attach material and said leadframe strip.

21. The method of claim 15 further including the step of injecting cooling air into said system upon completion of curing.

22. The method of claim 20 further including the step of injecting cooling air into said system upon completion of curing.

* * * * *